US009865535B2

(12) United States Patent
Masuoka et al.

(10) Patent No.: US 9,865,535 B2
(45) Date of Patent: Jan. 9, 2018

(54) SEMICONDUCTOR DEVICE

(71) Applicant: Unisantis Electronics Singapore Pte. Ltd., Singapore (SG)

(72) Inventors: Fujio Masuoka, Tokyo (JP); Hiroki Nakamura, Tokyo (JP); Nozomu Harada, Tokyo (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 0 days.

(21) Appl. No.: 15/346,176

(22) Filed: Nov. 8, 2016

(65) Prior Publication Data

US 2017/0125344 A1    May 4, 2017

Related U.S. Application Data

(63) Continuation of application No. PCT/JP2015/080952, filed on Nov. 2, 2015.

(51) Int. Cl.
| | |
|---|---|
| H01L 29/66 | (2006.01) |
| H01L 23/522 | (2006.01) |
| H01L 29/423 | (2006.01) |
| H01L 29/786 | (2006.01) |
| H01L 27/11 | (2006.01) |
| H01L 23/532 | (2006.01) |

(52) U.S. Cl.
CPC ...... *H01L 23/5228* (2013.01); *H01L 23/5226* (2013.01); *H01L 23/53271* (2013.01); *H01L 27/1104* (2013.01); *H01L 27/1116* (2013.01); *H01L 29/42392* (2013.01); *H01L 29/78618* (2013.01); *H01L 29/78642* (2013.01)

(58) Field of Classification Search
CPC .......... H01L 23/5228; H01L 29/42392; H01L 29/78642; H01L 23/53271; H01L 27/1104; H01L 27/1116; H01L 23/5226; H01L 29/78618
USPC ........................................................ 257/329
See application file for complete search history.

(56) References Cited

U.S. PATENT DOCUMENTS

| | | | |
|---|---|---|---|
| 8,008,177 B2* | 8/2011 | San | H01L 21/28518 438/581 |
| 8,053,842 B2* | 11/2011 | Masuoka | H01L 27/0207 257/369 |
| 2011/0115011 A1 | 5/2011 | Masuoka et al. | |

FOREIGN PATENT DOCUMENTS

| | | |
|---|---|---|
| JP | 02-071556 A | 3/1990 |
| JP | 02-188966 A | 7/1990 |
| JP | 03-145761 A | 6/1991 |
| JP | 2010-272874 A | 12/2010 |
| JP | 2011-108702 A | 6/2011 |
| JP | 2015-188155 A | 10/2015 |

* cited by examiner

*Primary Examiner* — Vu A Vu
(74) *Attorney, Agent, or Firm* — Brinks Gilson & Lione

(57) ABSTRACT

A semiconductor device includes a planar interconnection layer formed on a substrate and made of a semiconductor, a first pillar-shaped semiconductor layer formed on the interconnection layer, a semiconductor-metal compound layer formed so as to cover the entire upper surface of the interconnection layer except for a bottom portion of the first pillar-shaped semiconductor layer, a first gate insulating film surrounding the first pillar-shaped semiconductor layer, a first gate electrode surrounding the first gate insulating film, and a first gate line connected to the first gate electrode.

13 Claims, 1 Drawing Sheet

SEMICONDUCTOR DEVICE

CROSS-REFERENCE TO RELATED APPLICATION

The present application is a continuation application of PCT/JP2015/080952, filed Nov. 2, 2015, the entire contents of which are incorporated herein by reference.

BACKGROUND OF THE INVENTION

1. Field of the Invention

The present invention relates to a semiconductor device.

2. Description of the Related Art

The degree of integration of semiconductor integrated circuits, in particular, integrated circuits that use metal-oxide-semiconductor (MOS) transistors, has been increasing. With the increase in the degree of integration, MOS transistors used in the integrated circuits have been miniaturized to the nanometer scale. With such a miniaturization of MOS transistors, there may be a problem in that it becomes difficult to reduce a leakage current and the area occupied by circuits is not easily decreased from the viewpoint of ensuring a required amount of current. In order to address this problem, a surrounding gate transistor (SGT) has been proposed in which a source, a gate, and a drain are arranged in a direction perpendicular to a substrate and the gate surrounds a pillar-shaped semiconductor layer (refer to, for example, Japanese Unexamined Patent Application Publication Nos. 2-71556, 2-188966, and 3-145761).

For example, Japanese Unexamined Patent Application Publication No. 2015-188115 has proposed that a silicide is formed in a portion on the outside of an insulating film that is formed, as a sidewall, on a side wall of a gate electrode, the portion being a part of a planar semiconductor layer under a pillar-shaped semiconductor layer. With this structure, the resistance of a diffusion layer formed in the planar semiconductor layer under the pillar-shaped semiconductor layer is reduced. However, only the diffusion layer is disposed between a lower portion of the pillar-shaped semiconductor layer and the outside of the insulating film that is formed, as the sidewall, on the side wall of the gate electrode, and thus a reduction in the parasitic resistance has not been realized.

SUMMARY OF THE INVENTION

Accordingly, an object of the present invention is to provide a semiconductor device having a structure that enables a high-speed operation.

A semiconductor device according to an aspect of the present invention includes a planar interconnection layer formed on a substrate and made of a semiconductor, a first pillar-shaped semiconductor layer formed on the interconnection layer, a semiconductor-metal compound layer formed so as to cover the entire upper surface of the interconnection layer except for a bottom portion of the first pillar-shaped semiconductor layer, a first gate insulating film surrounding the first pillar-shaped semiconductor layer, a first gate electrode surrounding the first gate insulating film, and a first gate line connected to the first gate electrode.

The semiconductor device may include a first diffusion layer formed in an upper portion of the interconnection layer. The semiconductor-metal compound layer may be formed on the first diffusion layer.

The semiconductor device may include the first diffusion layer further formed in a lower portion of the first pillar-shaped semiconductor layer.

The semiconductor device may include a second diffusion layer formed in an upper portion of the first pillar-shaped semiconductor layer.

The first diffusion layer may have a first conductivity type.

The semiconductor device may include a second pillar-shaped semiconductor layer formed on the interconnection layer, a first gate insulating film surrounding the second pillar-shaped semiconductor layer, a second gate electrode surrounding the first gate insulating film, the first gate line connected to the second gate electrode, and a third diffusion layer having a second conductivity type and formed adjacent to the first diffusion layer that is formed in the upper portion of the interconnection layer. The semiconductor-metal compound layer may be formed on the third diffusion layer except for a bottom portion of the second pillar-shaped semiconductor layer. The semiconductor device may include the third diffusion layer further formed in a lower portion of the second pillar-shaped semiconductor layer.

The semiconductor device may include a fourth diffusion layer formed in an upper portion of the second pillar-shaped semiconductor layer.

The semiconductor device may include a third pillar-shaped semiconductor layer formed on the interconnection layer, a second gate insulating film surrounding the third pillar-shaped semiconductor layer, a third gate electrode surrounding the second gate insulating film, a second gate line connected to the third gate electrode, and a fifth diffusion layer having the first conductivity type and formed adjacent to the third diffusion layer that is formed in an upper portion of the interconnection layer. The semiconductor-metal compound layer may be formed on the fifth diffusion layer except for a bottom portion of the third pillar-shaped semiconductor layer. The semiconductor device may include the fifth diffusion layer further formed in a lower portion of the third pillar-shaped semiconductor layer.

The semiconductor device may include a sixth diffusion layer formed in an upper portion of the third pillar-shaped semiconductor layer.

The semiconductor device may include a first insulating film around the interconnection layer.

The semiconductor device may include a second insulating film between the first gate insulating film and the semiconductor-metal compound layer.

The semiconductor device may include a seventh diffusion layer having the first conductivity type and formed in the interconnection layer so as to be adjacent to lower portions of the first diffusion layer, the third diffusion layer, and the fifth diffusion layer.

The semiconductor device may include a first contact formed on the semiconductor-metal compound layer.

The semiconductor device may include a second contact formed on the first gate line.

According to the aspect of the present invention, a semiconductor device having a structure that enables a high-speed operation can be provided.

With the structure including a planar interconnection layer formed on a substrate and made of a semiconductor, a first pillar-shaped semiconductor layer formed on the interconnection layer, and a semiconductor-metal compound layer formed so as to cover the entire upper surface of the interconnection layer except for a bottom portion of the first pillar-shaped semiconductor layer, a semiconductor-metal compound is formed so as to cover the entire upper surface of the interconnection layer except for a bottom portion of the pillar-shaped semiconductor layer. Accordingly, the parasitic resistance between the outside of the gate electrode and a lower portion of the pillar-shaped semiconductor layer can be reduced.

The semiconductor device may include the third diffusion layer having the second conductivity type and formed adjacent to the first diffusion layer that is formed in an upper portion of the interconnection layer. Furthermore, the semiconductor-metal compound layer may be formed on the third diffusion layer except for a bottom portion of the second pillar-shaped semiconductor layer. Accordingly, in an inverter including the first pillar-shaped semiconductor layer and the second pillar-shaped semiconductor layer, the parasitic resistance of the first diffusion layer is reduced, and the parasitic resistance of the third diffusion layer is reduced. In addition, an output can be obtained by connecting the first diffusion layer and the third diffusion layer to each other through the semiconductor-metal compound layer.

Furthermore, the semiconductor device may include a third pillar-shaped semiconductor layer formed on the interconnection layer, a second gate insulating film surrounding the third pillar-shaped semiconductor layer, a third gate electrode surrounding the second gate insulating film, a second gate line connected to the third gate electrode, and a fifth diffusion layer having the first conductivity type and formed adjacent to the third diffusion layer that is formed in an upper portion of the interconnection layer. The semiconductor-metal compound layer may be formed on the fifth diffusion layer except for a bottom portion of the third pillar-shaped semiconductor layer. The semiconductor device may include the fifth diffusion layer further formed in a lower portion of the third pillar-shaped semiconductor layer. Accordingly, the parasitic resistance is reduced, and a static random access memory (SRAM) cell having a small occupation area can be realized by the interconnection layer under the pillar-shaped semiconductor layers.

The semiconductor device may include a second insulating film between the first gate insulating film and the semiconductor-metal compound layer. By covering the semiconductor-metal compound with the second insulating film, it is possible to prevent the first gate insulating film from being contaminated with a metal.

DESCRIPTION OF THE PREFERRED EMBODIMENTS

Figure 1A:
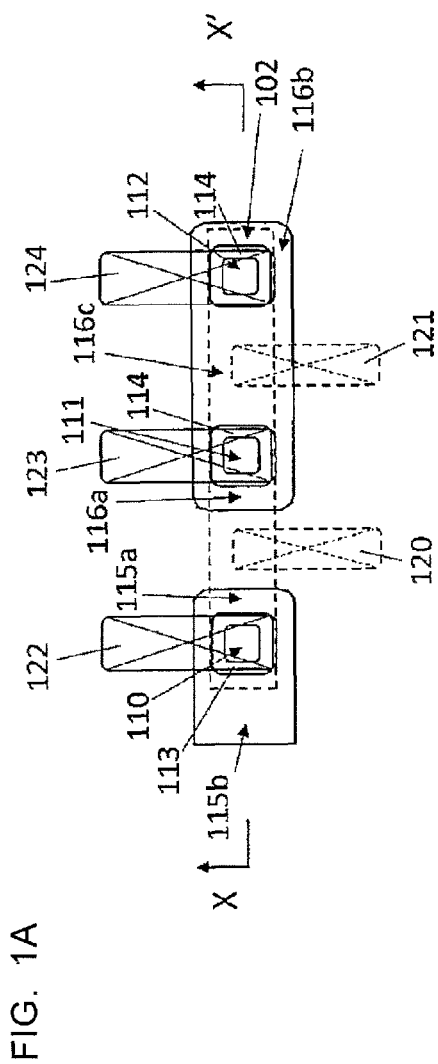
FIG. 1A is a plan view of a semiconductor device according to an embodiment of the present invention.
Figure 1B:
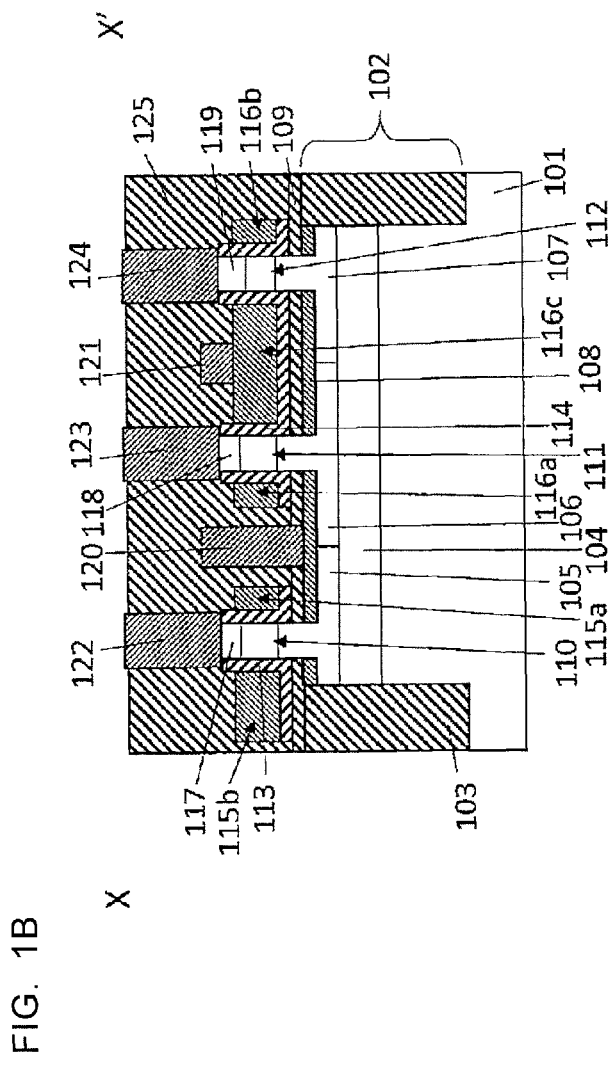
FIG. 1B is a sectional view taken along line X-X' in FIG. 1A.

A semiconductor device according to an embodiment of the present invention will now be described with reference to FIGS. 1A and 1B. Semiconductor layers of the present embodiment are preferably silicon layers. The semiconductor layers may be made of a group IV semiconductor such as Ge or C. Alternatively, the semiconductor layers may be made of a group III-V compound semiconductor.

A semiconductor device includes a planar interconnection layer 102 formed on a substrate 101 and made of a semiconductor, a first pillar-shaped semiconductor layer 112 formed on the interconnection layer 102, a semiconductor-metal compound layer 108 formed so as to cover the entire upper surface of the interconnection layer 102 except for a bottom portion of the first pillar-shaped semiconductor layer 112, a first gate insulating film 114 surrounding the first pillar-shaped semiconductor layer 112, a first gate electrode 116b surrounding the first gate insulating film 114, and a first gate line 116c connected to the first gate electrode 116b. The semiconductor-metal compound layer 108 preferably contains, as a metal, any one of nickel, tungsten, titanium, and cobalt. A high-melting-point metal may be used as the metal in the semiconductor-metal compound layer 108.

With the structure including the planar interconnection layer 102 formed on the substrate 101 and made of a semiconductor, the first pillar-shaped semiconductor layer 112 formed on the interconnection layer 102, and the semiconductor-metal compound layer 108 formed so as to cover the entire upper surface of the interconnection layer 102 except for a bottom portion of the first pillar-shaped semiconductor layer 112, a semiconductor-metal compound is formed so as to cover the entire upper surface of the interconnection layer except for a bottom portion of the pillar-shaped semiconductor layer. Accordingly, the parasitic resistance between the outside of the gate electrode and a lower portion of the pillar-shaped semiconductor layer can be reduced.

The first gate insulating film 114 preferably includes any of an oxide film, a nitride film, an oxynitride film, and a high-K dielectric film or at least one of an oxide film, a nitride film, an oxynitride film, and a high-K dielectric film.

The first gate electrode 116b is preferably made of a metal.

The semiconductor device includes a first diffusion layer 107 formed in an upper portion of the interconnection layer 102. The semiconductor-metal compound layer 108 is formed on the first diffusion layer 107.

The semiconductor device includes the first diffusion layer 107 further formed in a lower portion of the first pillar-shaped semiconductor layer 112.

The semiconductor device includes a second diffusion layer 119 formed in an upper portion of the first pillar-shaped semiconductor layer 112. The second diffusion layer 119 preferably has an n-type conductivity.

The first diffusion layer 107 has a first conductivity type. The first conductivity type is preferably an n-type.

The semiconductor device includes a second pillar-shaped semiconductor layer 111 formed on the interconnection layer 102, a first gate insulating film 114 surrounding the second pillar-shaped semiconductor layer 111, a second gate electrode 116a surrounding the first gate insulating film 114, the first gate line 116c connected to the second gate electrode 116a, and a third diffusion layer 106 having a second conductivity type and formed adjacent to the first diffusion layer 107 that is formed in the upper portion of the interconnection layer 102. The semiconductor-metal compound layer 108 is formed on the third diffusion layer 106 except for a bottom portion of the second pillar-shaped semiconductor layer 111. The semiconductor device includes the third diffusion layer 106 further formed in a lower portion of the second pillar-shaped semiconductor layer 111. The second conductivity type is preferably a p-type. The second gate electrode 116a is preferably made of a metal.

In an inverter including the first pillar-shaped semiconductor layer 112 and the second pillar-shaped semiconductor layer 111, the parasitic resistance of the first diffusion layer 107 is reduced, and the parasitic resistance of the third diffusion layer 106 is reduced. In addition, an output can be obtained by connecting the first diffusion layer 107 and the third diffusion layer 106 to each other through the semiconductor-metal compound layer 108.

The semiconductor device includes a fourth diffusion layer 118 formed in an upper portion of the second pillar-shaped semiconductor layer 111. The fourth diffusion layer 118 preferably has a p-type conductivity.

The semiconductor device includes a third pillar-shaped semiconductor layer 110 formed on the interconnection layer 102, a second gate insulating film 113 surrounding the third pillar-shaped semiconductor layer 110, a third gate electrode 115a surrounding the second gate insulating film 113, a second gate line 115b connected to the third gate electrode 115a, and a fifth diffusion layer 105 having the first conductivity type and formed adjacent to the third diffusion layer 106 that is formed in an upper portion of the interconnection layer 102. The semiconductor-metal compound layer 108 is formed on the fifth diffusion layer 105 except for a bottom portion of the third pillar-shaped semiconductor layer 110. The semiconductor device includes the fifth diffusion layer 105 further formed in a lower portion of the third pillar-shaped semiconductor layer 110.

A driver transistor including the first pillar-shaped semiconductor layer 112, a load transistor including the second pillar-shaped semiconductor layer 111, and a selection transistor including the third pillar-shaped semiconductor layer 110 are connected together under the pillar-shaped semiconductor layers 112, 111, and 110, respectively, through the interconnection layer 102. With this structure, the parasitic resistance is reduced, and an SRAM cell having a small occupation area can be realized. Such an SRAM cell can be formed by using two sets of transistors, the sets each including the driver transistor, the load transistor, and the selection transistor.

The second gate insulating film 113 preferably includes any of an oxide film, a nitride film, an oxynitride film, and a high-K dielectric film or at least one of an oxide film, a nitride film, an oxynitride film, and a high-K dielectric film.

The third gate electrode 115a is preferably made of a metal.

The semiconductor device includes a sixth diffusion layer 117 formed in an upper portion of the third pillar-shaped semiconductor layer 110. The sixth diffusion layer 117 preferably has an n-type conductivity.

The semiconductor device includes a first insulating film 103 around the interconnection layer 102.

The semiconductor device includes a second insulating film 109 between the first gate insulating film 114 and the semiconductor-metal compound layer 108. By covering the semiconductor-metal compound layer 108 with the second insulating film 109, it is possible to prevent the first gate insulating film 114 from being contaminated with a metal.

The semiconductor device further includes a seventh diffusion layer 104 having the first conductivity type and formed in the interconnection layer 102 so as to be adjacent to lower portions of the first diffusion layer 107, the third diffusion layer 106, and the fifth diffusion layer 105. With this structure, when the substrate 101 has a p-type conductivity, the substrate 101 can be electrically insulated from the seventh diffusion layer 104.

The semiconductor device includes a first contact 120 formed on the semiconductor-metal compound layer 108. In the case of an SRAM cell, the output of one inverter including the driver transistor and the load transistor can be connected to the input of the other inverter including another driver transistor and another load transistor with the first contact 120 therebetween.

The semiconductor device includes a second contact 121 formed on the first gate line 116c. In the case of an SRAM cell, the output of the other inverter including the other driver transistor and the other load transistor can be connected to the input of the one inverter including the driver transistor and the load transistor with the second contact 121 therebetween.

A contact 124 is formed on the first pillar-shaped semiconductor layer 112, a contact 123 is formed on the second pillar-shaped semiconductor layer 111, and a contact 122 is formed on the third pillar-shaped semiconductor layer 110. An interlayer insulating film 125 is further formed.

It is to be understood that various embodiments and modifications of the present invention can be made without departing from the broad spirit and the scope of the present invention. The embodiment described above is an illustrative example of the present invention and does not limit the scope of the present invention.

For example, in the above embodiment, a semiconductor device in which the p type (including the $p^+$ type) and the n type (including the $n^+$ type) are each changed to the opposite conductivity type is also covered by the technical scope of the present invention.

What is claimed is:

1. A semiconductor device comprising:
   a planar interconnection layer on a substrate and comprising a semiconductor;
   a first pillar-shaped semiconductor layer on the interconnection layer;
   a semiconductor-metal compound layer covering the entire upper surface of the interconnection layer except for a bottom portion of the first pillar-shaped semiconductor layer;
   a first gate insulating film surrounding the first pillar-shaped semiconductor layer;
   an insulating film underlying the first gate insulating film and separating the first gate insulating film and the semiconductor-metal compound layer;
   a first gate electrode surrounding the first gate insulating film; and
   a first gate line connected to the first gate electrode.

2. The semiconductor device according to claim 1, further comprising a first diffusion layer in an upper portion of the interconnection layer,
   wherein the semiconductor-metal compound layer is on the first diffusion layer.

3. The semiconductor device according to claim 2, wherein the first diffusion layer is further in a lower portion of the first pillar-shaped semiconductor layer.

4. The semiconductor device according to claim 2, further comprising a second diffusion layer in an upper portion of the first pillar-shaped semiconductor layer.

5. The semiconductor device according to claim 3, wherein the first diffusion layer has a first conductivity type.

6. The semiconductor device according to claim 5, further comprising:
   a second pillar-shaped semiconductor layer on the interconnection layer
   wherein, the first gate insulating film surrounding the second pillar-shaped semiconductor layer;
   a second gate electrode surrounding the first gate insulating film, the first gate line connected to the second gate electrode; and
   a third diffusion layer having a second conductivity type and adjacent to the first diffusion layer in the upper portion of the interconnection layer, wherein the semiconductor-metal compound layer is on the third diffusion layer except for a bottom portion of the second pillar-shaped semiconductor layer, and the third diffusion layer is further in a lower portion of the second pillar-shaped semiconductor layer.

7. The semiconductor device according to claim 6, further comprising a fourth diffusion layer in an upper portion of the second pillar-shaped semiconductor layer.

8. The semiconductor device according to claim 6, further comprising:
- a third pillar-shaped semiconductor layer on the interconnection layer;
- a second gate insulating film surrounding the third pillar-shaped semiconductor layer;
- a third gate electrode surrounding the second gate insulating film;
- a second gate line connected to the third gate electrode; and
- a fifth diffusion layer having the first conductivity type and adjacent to the third diffusion layer in an upper portion of the interconnection layer, wherein the semiconductor-metal compound layer is on the fifth diffusion layer except for a bottom portion of the third pillar-shaped semiconductor layer, and the fifth diffusion layer is further in a lower portion of the third pillar-shaped semiconductor layer.

9. The semiconductor device according to claim 8, further comprising a sixth diffusion layer in an upper portion of the third pillar-shaped semiconductor layer.

10. The semiconductor device according to claim 1, further comprising an insulating film around the interconnection layer.

11. The semiconductor device according to claim 8, further comprising a seventh diffusion layer having the first conductivity type and in the interconnection layer adjacent to lower portions of the first diffusion layer, the third diffusion layer, and the fifth diffusion layer.

12. The semiconductor device according to claim 8, further comprising a first contact on the semiconductor-metal compound layer.

13. The semiconductor device according to claim 8, further comprising a second contact on the first gate line.

* * * * *